United States Patent
Inagaki et al.

(10) Patent No.: US 9,553,007 B2
(45) Date of Patent: Jan. 24, 2017

(54) COATING METHOD AND COATING APPARATUS

(71) Applicants: Yukihiko Inagaki, Kyoto (JP); Tomohiro Goto, Kyoto (JP)

(72) Inventors: Yukihiko Inagaki, Kyoto (JP); Tomohiro Goto, Kyoto (JP)

(73) Assignee: SCREEN Semiconductor Solutions Co., Ltd. (JP)

(*) Notice: Subject to any disclaimer, the term of this patent is extended or adjusted under 35 U.S.C. 154(b) by 757 days.

(21) Appl. No.: 13/633,726

(22) Filed: Oct. 2, 2012

(65) Prior Publication Data
US 2013/0089664 A1  Apr. 11, 2013

(30) Foreign Application Priority Data
Oct. 5, 2011  (JP) .................................. 2011-221101

(51) Int. Cl.
| B05D 3/12 | (2006.01) |
| B05C 13/00 | (2006.01) |
| B05D 1/26 | (2006.01) |
| B05C 9/12 | (2006.01) |
| H01L 21/67 | (2006.01) |

(52) U.S. Cl.
CPC ................................ *H01L 21/6715* (2013.01)

(58) Field of Classification Search
CPC .................................................. H01L 21/6715
See application file for complete search history.

(56) References Cited

U.S. PATENT DOCUMENTS

| 5,658,615 A | 8/1997 | Hasebe et al. ................. 427/240 |
| 5,695,817 A | 12/1997 | Tateyama et al. ............ 427/240 |
| 5,935,331 A | 8/1999 | Naka et al. .................... 118/319 |
| 6,207,231 B1 * | 3/2001 | Tateyama ............... B05C 11/08 |
| | | 118/315 |

(Continued)

FOREIGN PATENT DOCUMENTS

| JP | H08-196983 A | 8/1996 |
| JP | 8-250389 | 9/1996 |

(Continued)

OTHER PUBLICATIONS

Korean Office Action dated Jun. 25, 2014, issued in corresponding Korean Patent Application No. 10-2012-0102806. (4 pages).

(Continued)

*Primary Examiner* — Dah-Wei D Yuan
*Assistant Examiner* — Kristen A Dagenais
(74) *Attorney, Agent, or Firm* — Ostrolenk Faber LLP

(57) ABSTRACT

A coating method includes a step of forming a film of a coating solution having a larger thickness in a central region of a substrate than in an edge region of the substrate by discharging droplets of the coating solution from a plurality of nozzles formed on an inkjet head to the substrate, and a step of moving the coating solution in the film from the central region toward the edge region of the substrate by rotating the substrate. This reduces a difference in thickness of the film between the central region and the edge region of the substrate, thereby to make the film thickness substantially uniform. At the same time, the movement of the coating solution in the film can make the surface of the film smoother.

23 Claims, 10 Drawing Sheets

(56) References Cited

U.S. PATENT DOCUMENTS

| | | | |
|---|---|---|---|
| 2004/0071872 A1* | 4/2004 | Kawase | H01L 21/6715 427/240 |
| 2007/0289530 A1* | 12/2007 | Kataho | B82Y 10/00 118/699 |
| 2010/0112209 A1 | 5/2010 | Yoshihara et al. | 427/240 |

FOREIGN PATENT DOCUMENTS

| | | | |
|---|---|---|---|
| JP | 09010657 A | * | 1/1997 |
| JP | H09-10657 A | | 1/1997 |
| JP | 2001-327912 | | 11/2001 |
| JP | 2002-28552 | | 1/2002 |
| JP | 2002-66391 | | 3/2002 |
| JP | 2004-47579 A | | 2/2004 |
| JP | 2006-320807 A | | 11/2006 |
| JP | 2008-253986 A | | 10/2008 |
| JP | 2009-013904 A | | 1/2009 |
| JP | 2010-207788 A | | 9/2010 |
| KR | 10-1994-0022743 A1 | | 10/1994 |
| KR | 10-1996-0009054 | | 3/1996 |
| KR | 10-2011-0058566 | | 6/2011 |
| KR | 10-2011-0095122 | | 8/2011 |
| TW | I242663 | | 11/2005 |

OTHER PUBLICATIONS

Notice of Allowance dated Jan. 30, 2015, issued in corresponding Korean Patent Application No. 10-2012-0102806.

Korean Office Action dated Dec. 19, 2013, issued in corresponding Korean Patent Application No. 10-2012-0102806. (5 pages).

Office Action and Search Report dated Apr. 28, 2015 corresponding to Taiwan Patent Application No. 101136750.

Notification for Reasons for Refusal dated Mar. 17, 2015 in the corresponding Japanese Application No. JP 2011-221101.

Notification for Reasons for Refusal dated Oct. 20, 2015 in the corresponding Japanese Application No. JP 2011-221101.

\* cited by examiner

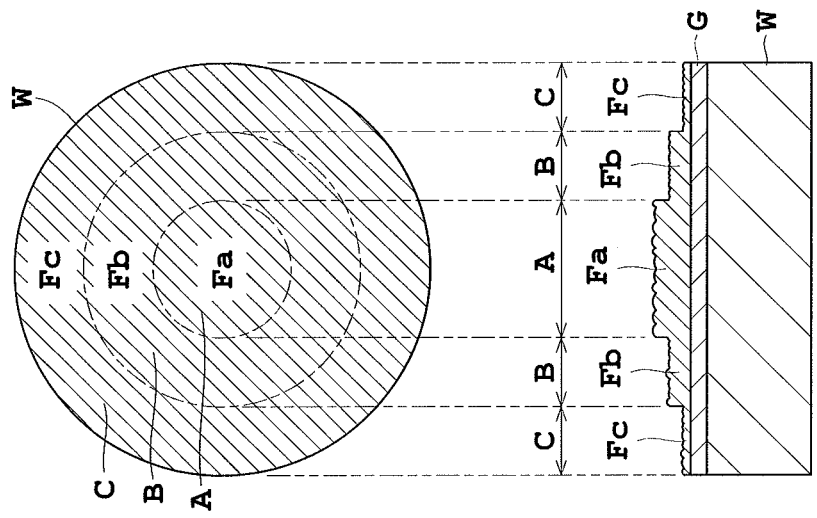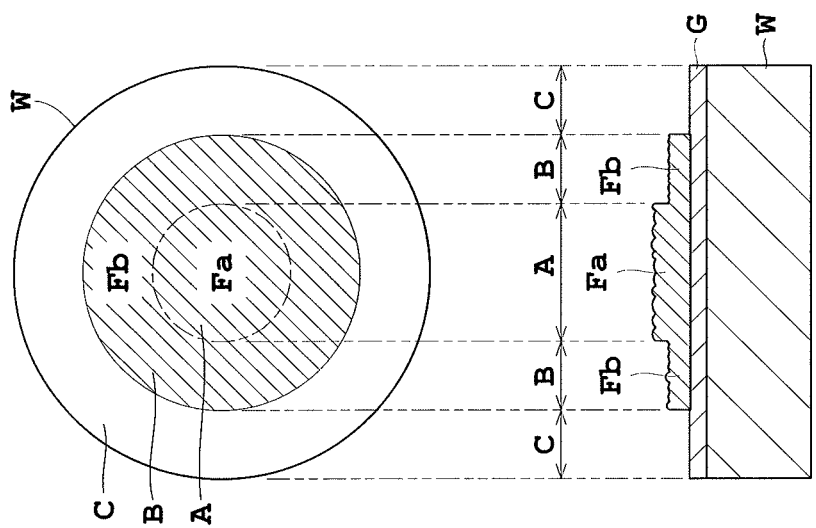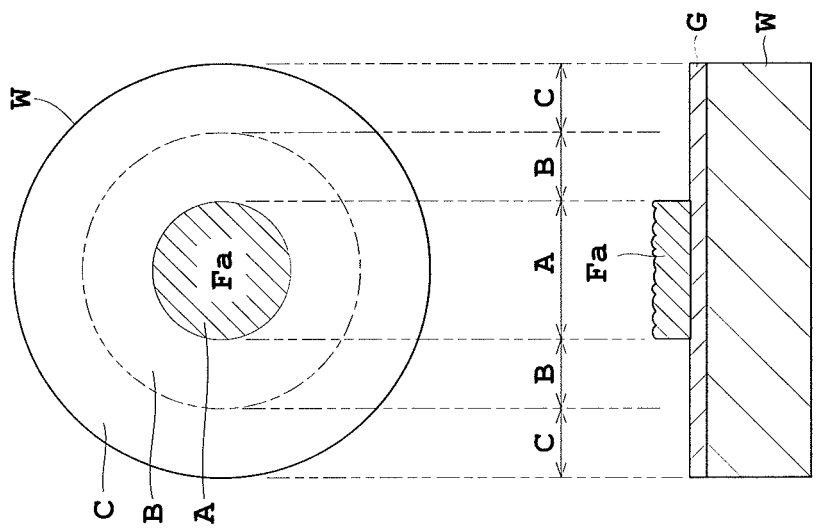

COATING METHOD AND COATING APPARATUS

BACKGROUND OF THE INVENTION (1) Field of the Invention

This invention relates to a coating method and a coating apparatus for applying a coating solution, e.g. an SOG (Spin On Glass) solution (also called silica film forming material), a resist sensitizing agent or a polyimide resin to semiconductor wafers, glass substrates for photomasks, glass substrates for liquid crystal displays or substrates for optical disks (hereinafter called simply the substrates). More particularly, the invention relates to a technique for forming a film of the coating solution on a substrate with high accuracy.

(2) Description of the Related Art

Conventionally, what is called the spin coat method is used as this type of method. The spin coat method is a method of forming a thin film of the coating solution on a substrate by supplying the coating solution to a central region of the substrate, and spinning the substrate at high speed to apply centrifugal force to the coating solution and spread the coating solution to edges of the substrate. When the coating solution is spread, an excess part of the coating solution supplied to the substrate is spun off the substrate to be discarded. This constitutes a bad use efficiency of the coating solution, resulting in large consumption of the coating solution.

Besides the spin coat method, there is a method based on an inkjet mode. This method forms a film on a substrate by discharging minute droplets of the coating solution from nozzles of an inkjet head uniformly over the substrate. This method, which is capable of forming a film without spinning the substrate to apply and spread the coating solution, can reduce consumption of the coating solution (as disclosed in Japanese Unexamined Patent Publication No. 2002-66391, for example).

However, the conventional example with such construction has the following problem.

The inkjet mode, since a film is formed of an aggregation of droplets, has a disadvantage that it is difficult to smooth the surface of the film.

SUMMARY OF THE INVENTION

This invention has been made having regard to the state of the art noted above, and its object is to provide a coating method and a coating apparatus which, while discharging a coating solution from nozzles of an inkjet head and forming a film of the coating solution, can make a film surface of the coating solution smoother.

The above object is fulfilled, according to this invention, by a coating method comprising a step of forming a film of a coating solution having a larger thickness in a central region of a substrate than in an edge region of the substrate by discharging droplets of the coating solution from a plurality of nozzles formed on an inkjet head to the substrate; and a step of moving the coating solution in the film from the central region toward the edge region of the substrate by rotating the substrate.

In the coating method according to this invention, the step of forming the film is executed to form the film on the substrate by discharging droplets of the coating solution from the nozzles of the inkjet head to the substrate. The film formed is relatively thin in the edge region of the substrate, and relatively thick in the central region of the substrate. Since the nozzles discharge minute droplets of the coating solution in an inkjet mode, the discharge quantity of the coating solution can be adjusted finely according to positions of the substrate. The film thickness can therefore be varied with high accuracy according to positions of the substrate as noted above.

In the step of moving the coating solution in the film, the substrate is rotated to apply centrifugal force to the film. The coating solution on the substrate, which forms the film, moves from the central region toward the edge region of the substrate. This reduces the difference in thickness of the film between the central region and the edge region of the substrate, thereby to make the film thickness substantially uniform over the substrate surface. At the same time, the movement of the coating solution in the film can make the surface of the film smoother.

In the invention noted above, the step of forming the film may be executed to form the film which has a thickness increasing from the edge region toward the central region of the substrate. The "thickness increasing" is meant to include all of the case where the film thickness increases gradually, the case where the film thickness increases stepwise, and the case where the film thickness increases at a constant rate. Since the film thickness changes over the edge region and the central region of the substrate to be the thicker toward the central region, the step of moving the coating solution in the film can make the film thickness still more uniform.

In the invention noted above, the step of forming the film may be executed to form the film which has different thicknesses between a plurality of areas in shape of concentric circles dividing the substrate, the thicknesses increasing stepwise from an outward area to an inward area. With this arrangement, the film may be formed to have a uniform thickness within each area. Therefore, the film can be formed simply.

In the invention noted above, the step of forming the film may be executed to discharge the droplets from the nozzles to the substrate while moving the inkjet head and the substrate relative to each other at least by rotating the substrate, a rotating speed of the substrate in the step of forming the film being lower than a rotating speed of the substrate in the step of moving the coating solution in the film. Since the film is formed while rotating the substrate at a relatively low speed, the film can be formed with high accuracy. In the step of moving the coating solution in the film, the substrate is rotated at a relatively high speed, thereby to improve the uniformity of the film thickness advantageously.

In the invention noted above, the step of forming the film may include a step of discharging the droplets from the nozzles while keeping the inkjet head at rest and rotating the substrate; and a step of moving the inkjet head radially of the substrate; the film being formed by repeating an alternation of the step of discharging the droplets and the step of moving the inkjet head. In the step of discharging droplets, the position of each nozzle does not change in the radial direction of the substrate. This can simplify control of a discharge quantity of the coating solution from each nozzle. Since the step of moving the inkjet head is provided, even if the inkjet head is small compared with the substrate, the film of the coating solution can be formed conveniently over the entire surface of the substrate.

In the invention noted above, the step of forming the film may be executed to place the inkjet head over the central region and the edge region of the substrate, and discharge the droplets from the nozzles to the substrate while rotating the substrate. This can complete formation of the film only by one rotation of the substrate.

In the invention noted above, the step of forming the film may be executed to discharge the droplets from the nozzles to the substrate while translating the inkjet head without rotating the substrate. This method translates only the inkjet head instead of rotating it in a state of keeping the substrate at rest. Therefore, compared with the case of rotating the inkjet head, an amount of movement (displacement) of each nozzle relative to the substrate can be made uniform. Therefore, the discharge quantity of the coating solution per unit area can be adjusted easily, and the thickness of the film can be adjusted easily.

In the invention noted above, the method may comprise a step of supplying a solvent of the coating solution to the substrate before the step of forming the film. The solvent supplied to the substrate beforehand allows the coating solution discharged onto the substrate to spread easily thereon. Therefore, in the step of moving the coating solution in the film, the coating solution forming the film can move easily, thereby to improve the uniformity of the film thickness advantageously.

In the invention noted above, the method may comprise a step of keeping the substrate at rest after the step of forming the film and before the step of moving the coating solution in the film. In the step of keeping the substrate at rest, the droplets adjoining one another on the substrate can be further blended together, which promises a continuation of droplets with increased smoothness. Therefore, in the step of moving the coating solution in the film, the surface of the film can be smoothed easily.

In the invention noted above, the step of forming the film may be executed to reduce a size of the droplets discharged from the nozzles for the edge region of the substrate compared with the central region of the substrate. In the invention noted above, the step of forming the film may be executed to reduce a frequency of discharging the droplets from the nozzles for the edge region of the substrate compared with the central region of the substrate. The discharge quantity of the coating solution can be adjusted finely by changing the size or discharge frequency of the droplets, thereby to adjust the film thickness with high accuracy. According to these methods, therefore, the film of the coating solution may be shaped effectively to be thicker in the central region of the substrate than in the edge region of the substrate.

In another aspect of this invention, a coating apparatus comprises a rotating holder for rotatably holding a substrate; an inkjet head having a plurality of nozzles for discharging droplets of a coating solution; a relative moving mechanism for moving the inkjet head and the substrate relative to each other; and a controller for controlling the nozzles to discharge the droplets from the nozzles to the substrate while controlling the relative moving mechanism to move the substrate and the inkjet head relative to each other, thereby forming a film of the coating solution having a larger thickness in a central region of the substrate than in an edge region of the substrate, and subsequently controlling the rotating holder to rotate the substrate and move the coating solution in the film from the central region toward the edge region of the substrate.

In the coating apparatus according to this invention, the controller first controls the relative moving mechanism and the nozzles to form a film of the coating solution over the entire substrate. The film formed is relatively thin in the edge region of the substrate, and relatively thick in the central region of the substrate. Then, the controller controls the rotating holder to rotate the substrate and apply centrifugal force to the film. The coating solution included in the film on the substrate moves from the central region toward the edge region of the substrate. This reduces the difference in thickness of the film between the central region and the edge region of the substrate, thereby to make the film thickness substantially uniform over the entire substrate. The movement of the coating solution in the film can level the surface of the film to be smoother. Thus, this apparatus can carry out the foregoing method advantageously.

In the apparatus according to the invention noted above, the controller may be arranged to adjust at least one of a size of the droplets discharged from the nozzles and a frequency of discharging the droplets from the nozzles. With this construction, the controller can adjust the discharge quantity of coating solution and the thickness of the film advantageously according to positions on the substrate.

In the apparatus according to the invention noted above, the rotating holder may double as the relative moving mechanism; the relative moving mechanism may further include a head moving mechanism for moving the inkjet head radially of the substrate; and the controller may be arranged to move the substrate and the inkjet head relative to each other by controlling the rotating holder and the head moving mechanism to rotate the substrate and move the inkjet head radially of the substrate. With this construction, the inkjet head can be moved circumferentially as well as radially of the substrate. By each movement or by combination of these movements, the inkjet head can be moved relative to the substrate and to a selected position in a selected direction on the substrate. Even if the inkjet head is small compared with the substrate, the inkjet head can be moved to a selected position on the substrate.

In the apparatus according to the invention noted above, the inkjet head may be placeable over an area from the central region to the edge region of the substrate; the rotating holder may double as the relative moving mechanism; and the controller may be arranged to move the substrate and the inkjet head relative to each other by controlling the rotating holder to rotate the substrate in a state of the inkjet head placed over the area from the central region to the edge region of the substrate. This construction can complete formation of the film only by one rotation of the substrate.

In the apparatus according to the invention noted above, the relative moving mechanism may be a head moving mechanism for translating the inkjet head; and the controller may be arranged to move the substrate and the inkjet head relative to each other by controlling the head moving mechanism to move the inkjet head relative to the substrate at rest. According to this construction, the controller translates only the inkjet head without rotating the substrate. Therefore, compared with the case of rotating the inkjet head, an amount of movement (displacement) of each nozzle relative to the substrate can be made uniform. Therefore, the discharge quantity of the coating solution per unit area can be adjusted easily, and the thickness of the film can be adjusted easily.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIGS. 6A, 6B and 6C are views each showing a film formed on the substrate, in which FIG. 6A shows a state of having formed a film in area A, FIG. 6B shows a state of having formed films in areas A and B, and FIG. 6C shows a state of having formed films in areas A to C;

DESCRIPTION OF THE PREFERRED EMBODIMENTS

Preferred embodiments of this invention will be described in detail hereinafter with reference to the drawings.

Embodiment 1

Figure 1:
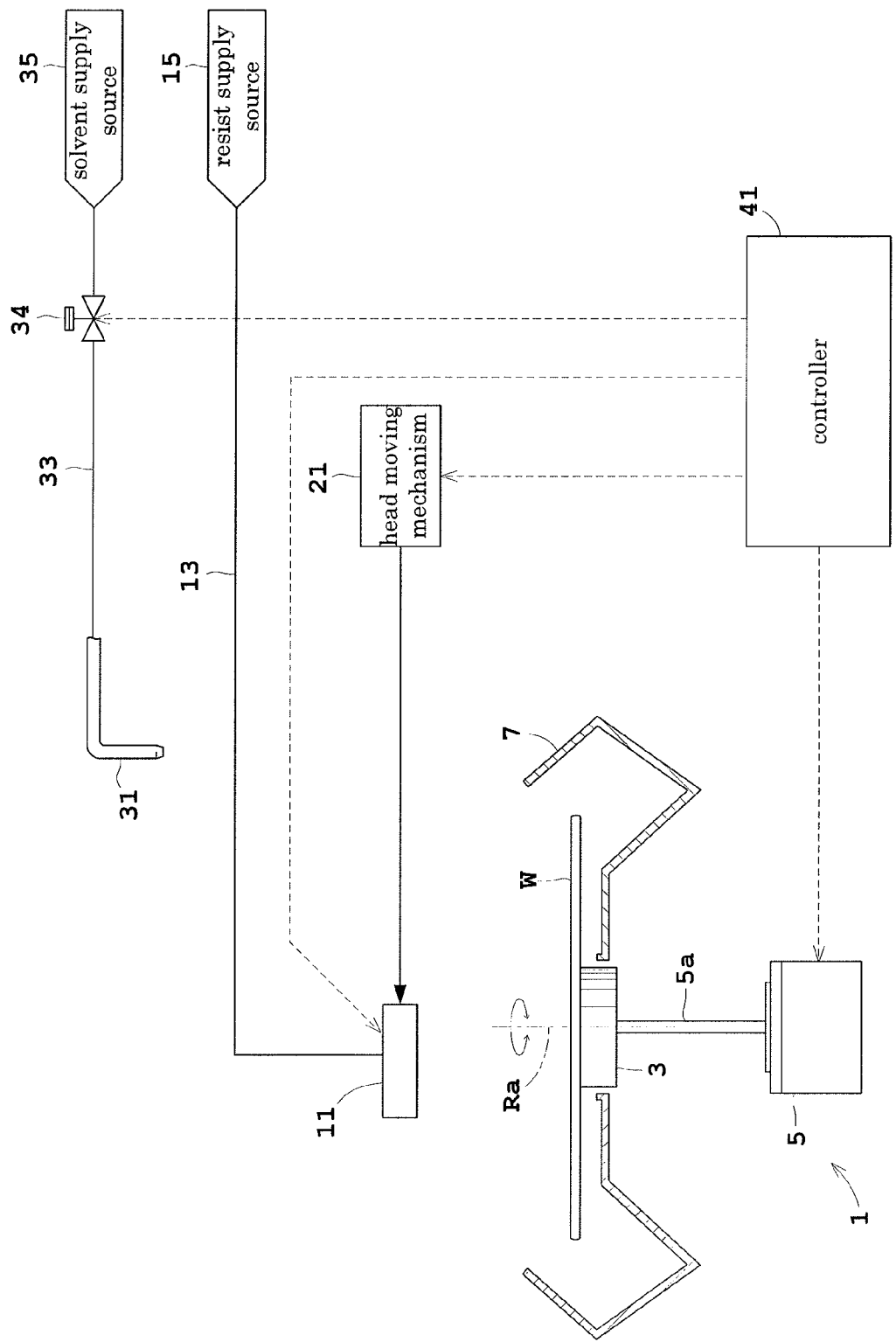
FIG. 1 is a view showing an outline construction of a coating apparatus according to Embodiment 1.

FIG. 1 is a view showing an outline construction of a coating apparatus according to Embodiment 1. This embodiment will be described taking for example a coating apparatus and a coating method for coating a resist sensitizing agent (hereinafter called "resist" as appropriate) as a coating solution.

The coating apparatus has a rotating holder 1 for rotatably holding a substrate or semiconductor wafer W. The rotating holder 1 includes a spin chuck 3 and a motor 5. The spin chuck 3 holds the wafer W in a substantially horizontal position by sucking the wafer W at the center of a lower surface thereof. The motor 5 has an output shaft 5a thereof having a distal end connected to the center of a bottom of the spin chuck 3. With the motor 5 rotating the output shaft 5a, the spin chuck 3 and wafer W rotate together about a rotational axis Ra. The rotational axis Ra extends substantially through the center of the wafer W.

The rotating holder 1 is not limited to the above example. For example, the spin chuck 3 may be replaced with a spin plate having a plurality of pins for holding edges of the wafer W.

The spin chuck 3 is surrounded by a scatter preventive cup 7. The scatter preventive cups 7 guides downward and collect the resist, solvent and the like scattering around from the periphery of the wafer W.

This apparatus includes an inkjet head 11 for supplying the resist to the wafer W. The inkjet head 11 is connected through piping 13 to a resist supply source 15.

Figure 2:
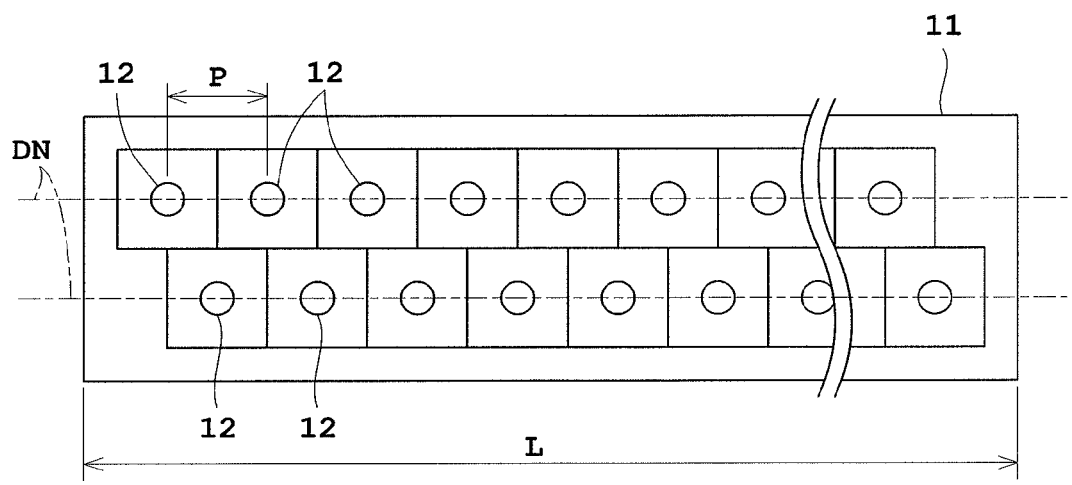
FIG. 2 is a view showing a bottom surface of an inkjet head.

Reference is made to FIG. 2. FIG. 2 is a view showing a bottom surface of the inkjet head 11. The inkjet head 11 has a plurality (e.g. several tens to several hundreds) of inkjet type nozzles 12 formed on the bottom surface thereof. The inkjet head 11 has a length L in a longitudinal direction thereof which is shorter than the radius of the wafer W.

The nozzles 12 are arranged zigzag to form two rows. The direction of arrangement of the nozzles 12 will be called herein the "direction of the rows DN" as appropriate. The pitch P between the nozzles 12 adjoining in the direction of the rows DN is 0.1 [mm] to 0.2 [mm], for example. Droplets discharged from each nozzle 12 are several [pl] to several tens of [pl], for example. The frequency with which each nozzle 12 discharges droplets (hereinafter called "discharge frequency") is several tens of [kHz] at most, for example. That is, the number of times each nozzle 12 can discharge droplets in one second is several tens of thousands at most, for example.

Each nozzle 12 has a piezo element (not shown) provided as an actuator. The size of droplets discharged from each nozzle 12 can be adjusted by varying the level of voltage applied to the piezo element. The discharge frequency of each nozzle 12 can be adjusted by varying pulse intervals of the voltage applied to the piezo element.

As shown in FIG. 1, this apparatus has a head moving mechanism 21 for movably supporting the inkjet head 11. The head moving mechanism 21 moves the inkjet head 11 backward and forward between a position over the wafer W (i.e. the position of inkjet head 11 shown in FIG. 1) and a position away from over the wafer W (hereinafter called the "withdrawn position"). For expediency of illustration, FIG. 1 shows a relatively large spacing between the lower surface of the inkjet head 11 and the upper surface of the wafer W. However, it is preferable that the inkjet head 11 is close to the upper surface of the wafer W.

Figure 3:
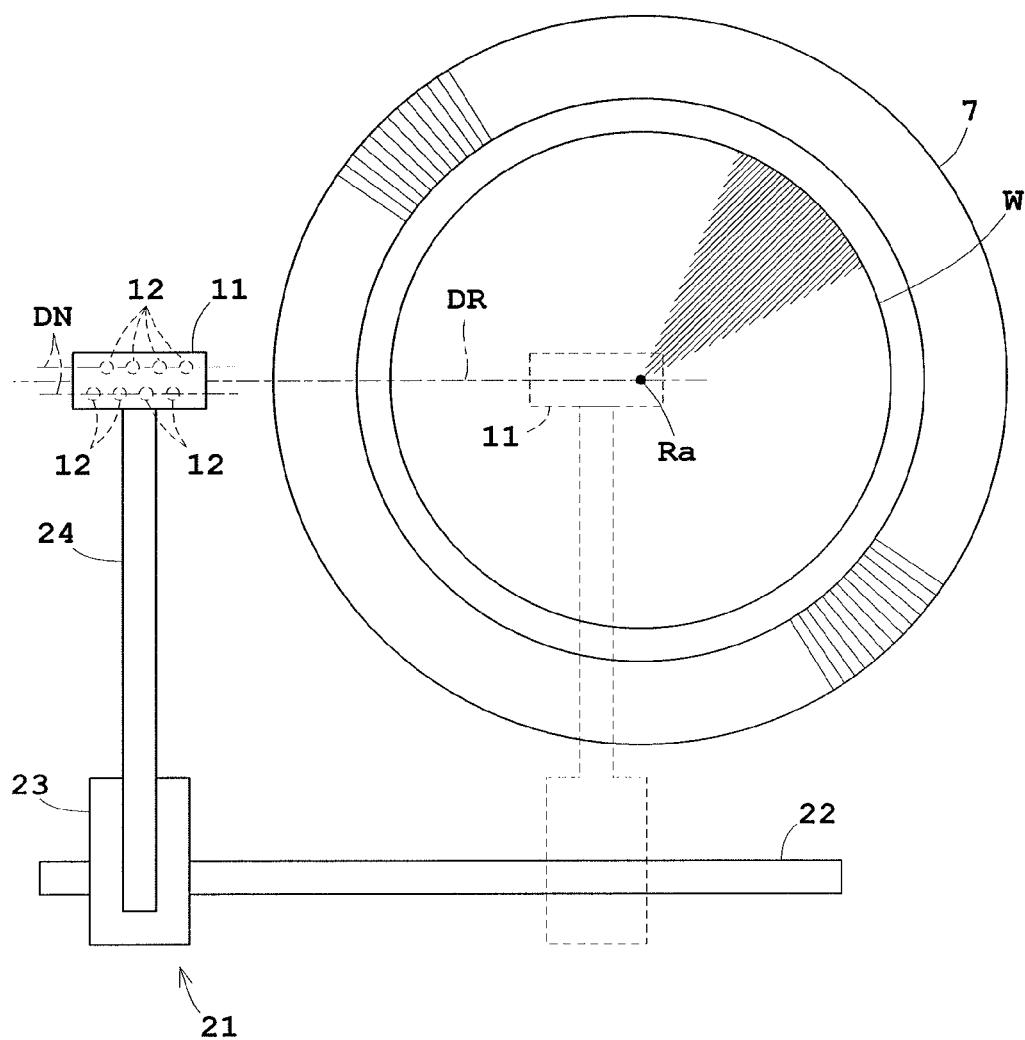
FIG. 3 is a plan view of the coating apparatus according to Embodiment 1.

The construction of the head moving mechanism 21 will be described with reference to FIG. 3. FIG. 3 is a plan view of the coating apparatus. The head moving mechanism 21 has a rail 22, a self-propelled block 23 and an arm 24. The rail 22 is disposed laterally of the scatter preventive cup 7 to extend in a horizontal, uniaxial direction. The self-propelled block 23 is slidably mounted on the rail 22. A proximal end of the arm 24 is connected to an upper portion of the self-propelled block 23. The arm 24 extends from the proximal end in a direction substantially perpendicular to the rail 22, to support the inkjet head 11 at a distal end thereof. The self-propelled block 23, when driven, will move along the rail 22. The inkjet head 11 will move backward and forward in the horizontal uniaxial direction between the withdrawn position (i.e. the position of inkjet head 11 shown in solid lines in FIG. 3) and the position over the wafer W (i.e. the position of inkjet head 11 shown in dotted lines in FIG. 3).

In this embodiment, the head moving mechanism 21 is constructed to move the inkjet head 11 through a position on the rotational axis Ra. That is, the inkjet head 11 is movable in a radial direction DR of the wafer W. The radial direction DR of the wafer W is a direction perpendicular to the rotational axis Ra of the wafer W, and is substantially in agreement with the direction of a radius of the wafer W. The inkjet head 11 is supported by the arm 24 to have the direction of the rows DN of the nozzles 12 in agreement with the radial direction DR of the wafer W (that is, the moving direction of the inkjet head 11). The head moving mechanism 21 corresponds to the relative moving mechanism in this invention. The rotating holder 1 noted above acts also as the relative moving mechanism in this invention.

Reference is made to FIG. 1. This apparatus includes a solvent feeder 31 for supplying a solvent of the coating solution (resist) to the wafer W. The solvent feeder 31 is connected to a solvent supply source 35 through piping 33 and a switch valve 34. When the switch valve 34 is opened, the solvent feeder 31 will continuously supply the solvent to the wafer W (i.e. the solvent is discharged at a constant flow rate). When the switch valve 34 is closed, the solvent feeder 31 will stop supplying the solvent to the wafer W.

Where the coating solution is a resist, the solvent may, for example, be PGMEA, emulsifying ethyl, or IPA, for example. The solvent feeder 31 is movable by a solvent feeder moving mechanism, backward and forward between a position over the wafer W and a withdrawn position away from over the wafer W (i.e. the position of solvent feeder 31 shown in solid lines in FIG. 1).

This apparatus has a controller 41 for performing overall control of the components described above. Specifically, the controller 41 controls the motor 5 to adjust the number of rotations (rotating rate) of the wafer W, and controls the head moving mechanism 21 to move the inkjet head 11. The controller 41 controls each nozzle 12, as interlocked with the controls of the motor 5 and head moving mechanism 21, to adjust a discharge quantity of resist. The discharge quantity is adjusted, for example, by varying the level and/or pulse intervals of the voltage applied to the piezo element of each nozzle 12 to adjust the size and/or discharge frequency of droplets. Further, the controller 41 controls the solvent feeder moving mechanism not shown, to move the solvent feeder 31, and controls the switch valve 34 to switch between supplying and stopping of the solvent.

The controller 41 has a treating recipe with treatment conditions set beforehand for treating the wafer W. The treatment conditions include, for example, information on a first and a second speeds which are rotating speeds of the wafer W as described hereinafter, and information on discharge quantities of resist according to positions/areas within the wafer W. The information on the discharge quantities of resist may include information on droplet sizes and discharge frequencies, for example. The controller 41 is realized by a central processing unit (CPU) for performing various processes, a RAM (Random-Access Memory) providing workspace for arithmetic processes, a storage medium such as a fixed disk for storing a variety of information, and so on.

Figure 4:
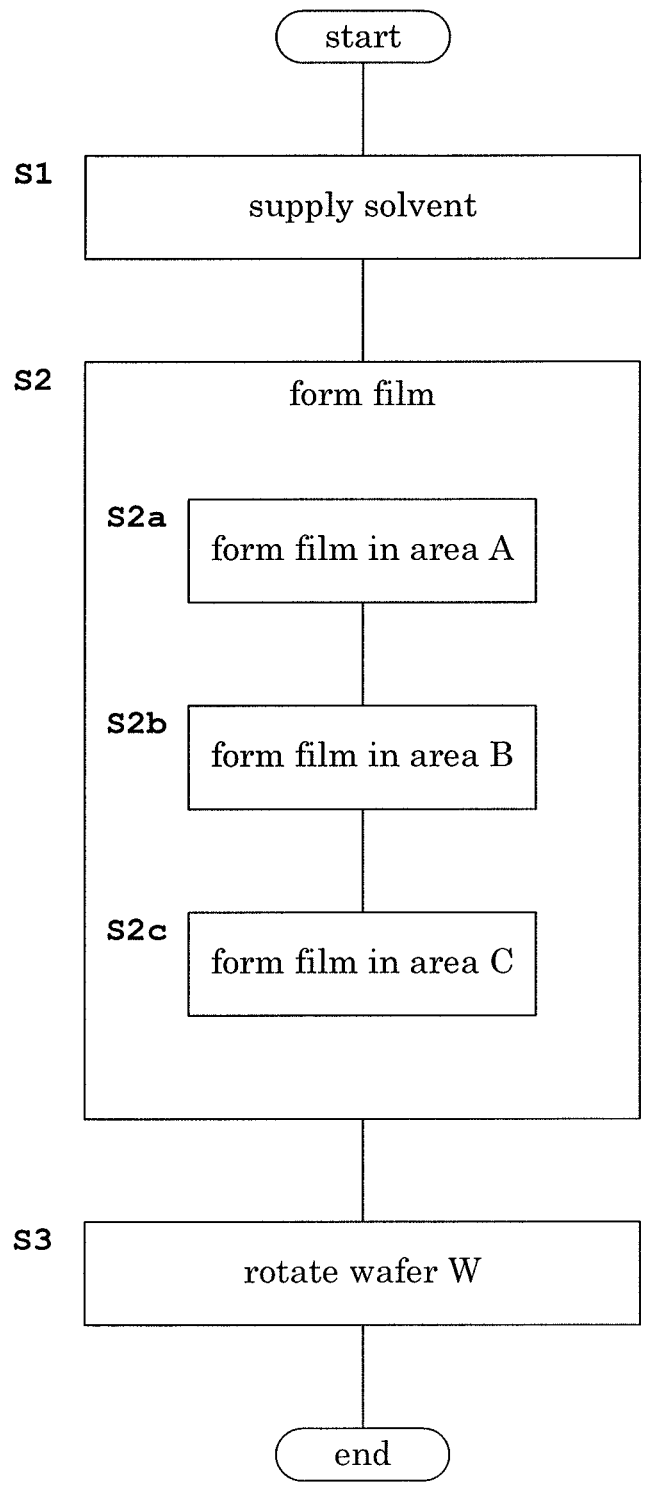
FIG. 4 is a flow chart showing operation of the coating apparatus according to Embodiment 1.

Next, operation of the coating apparatus (coating method) according to Embodiment 1 will be described. FIG. 4 is a flow chart showing operation of the coating apparatus. It is assumed that the wafer W has been transported to the coating apparatus from outside, and is already held by the spin chuck 3.

<Step S1> Supply Solvent (Step of Supplying Solvent of Coating Solution to Substrate)

The controller 41 controls the solvent feeder moving mechanism, not shown, to move the solvent feeder 31 from the withdrawn position to the position over the wafer W. Then, the controller 41 opens the switch valve 34 to supply the solvent from the solvent feeder 31 onto the wafer W, and controls the motor 5 to rotate the wafer W. The solvent spreads over the entire surface of the wafer W, and part of the solvent spins off the wafer W to be discarded to the ambient of the wafer W. The discarded part of the solvent is collected by the scatter preventive cup 7. Consequently, a film of the solvent is formed over the entire surface of the wafer W. Upon lapse of a predetermined time, the controller 41 closes the switch valve 34, moves the solvent feeder 31 to the withdrawn position, and stops the rotation of the wafer W.

<Step S2> Form Film (Step of Forming Film)

This step S2 divides the upper surface of the wafer W into three virtual areas A, B and C, and forms film in each of the areas A, B and C. The areas A to C are in the shape of concentric circles centering on the rotational axis Ra, respectively. The area A is an innermost circular area, the area C is an outermost annular area, and the area B is an annular area between area A and area C. The central region in this invention is included in the area A, and the edge region in this invention is included in the area C. The steps of forming film in the respective areas A, B and C are regarded hereinafter as steps S2a, S2b and S2c, and these steps S2a to S2c will be described in order.

<Step S2a> Form Film in Area A

The controller 41 controls the head moving mechanism 21 to move the inkjet head 11 onto the rotational axis Ra of the wafer W and put the inkjet head 11 at rest in that position. Then, the controller 41 refers to the treating recipe, controls the motor 5 to rotate the wafer W at a first constant speed, and controls each nozzle 12 to discharge droplets of the resist to the wafer W. At this time, the controller 41 controls also a discharge quantity of the resist based on the treating recipe. The first speed of the wafer W, preferably, is low speed which is, for example, 60 [rpm].

The inkjet head 11 makes a rotating movement in a circumferential direction at uniform speed relative to the wafer W. Droplets of the resist discharged from nozzles 12 impinge on a range of the wafer W opposed to the inkjet head 11 to form a film (specifically, a resist film) there.

Figure 5A:
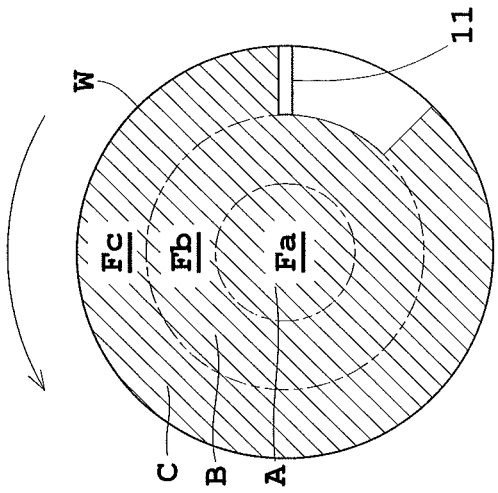
FIGS. 5A, 5B and 5C are views each schematically showing a film being formed in each area of a substrate.
Figure 5B:
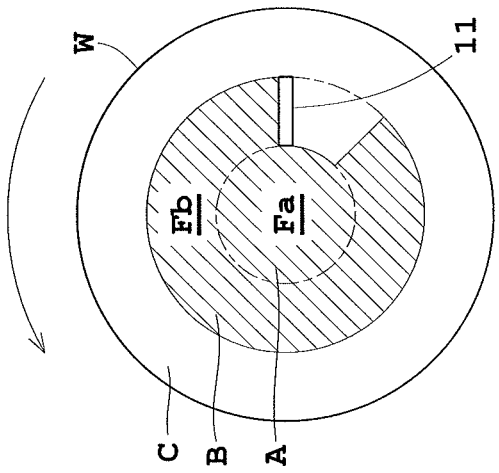
Figure 5C:
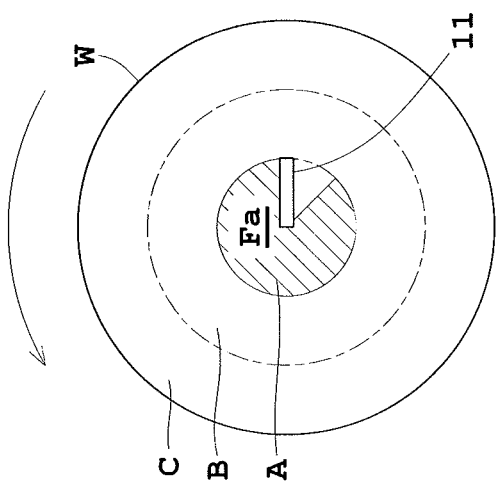

Reference is made to FIGS. 5A, 5B and 5C. FIGS. 5A, 5B and 5C are views each schematically showing a film being formed in each of the areas A, B and C of the wafer W. FIG. 5A shows a state during execution of this step S2a. In FIGS. 5A, 5B and 5C, signs Fa, Fb and Fc indicates the films formed in the areas A, B and C, respectively (which are the same also in FIGS. 6A, 6B and 6C describes hereinafter).

When the wafer W makes one rotation, the controller 41 stops rotation of the wafer W, and stops discharge of the droplets from the nozzles 12.

Reference is made to FIGS. 6A, 6B and 6C. FIGS. 6A, 6B and 6C are plan views and sectional views showing the films formed on the wafer W. FIG. 6A shows a state of having formed a film only in the area A, FIG. 6B shows a state of having formed films in the areas A and B, and FIG. 6C shows a state of having formed films in the areas A to C. FIGS. 6A, 6B and 6C show the plan views in upper portions and the sectional views in lower portions. In FIGS. 6A, 6B and 6C, sign G indicates the solvent coating the wafer W (which is the same also in FIGS. 7A, 7B, 11 and 12 described hereinafter).

At completion of step S2a, as shown in FIG. 6A, film Fa is formed only in the area A. As shown, the film Fa has irregularities remaining on its surface (upper surface) and to corresponding to shapes of the droplets having impinged on the wafer W, and thus the surface of the film Fa is not smooth.

<Step S2b> Form Film in Area B

The controller 41 controls the head moving mechanism 21 to move the inkjet head 11 by a distance corresponding to its length L outward in the radial direction DR. As shown in FIG. 5B, the inkjet head 11 stands still in a position adjoining a periphery of the above area A having the film formed therein. Then, the controller 41 rotates the wafer W at the first speed, and discharges droplets of the resist from each nozzle 12. Consequently, film Fb is formed in the area B outward of the area A.

When the film Fb is formed in this area B, the controller 41 adjusts the discharge quantity of resist based on the treating recipe to make the film Fb thinner than the film Fa. In other words, the controller 41 reduces the discharge quantity of resist per unit area for the area B compared with the area A. As a specific method for reducing the discharge quantity of resist, for example, the size of droplets discharged from the nozzles 12 may be reduced, and/or the discharge frequency of the nozzles 12 may be reduced.

When the wafer W makes one rotation, the controller 41 stops rotation of the wafer W, and stops discharge of the droplets from the nozzles 12.

As a result, as shown in FIG. 6B, the area B has the film Fb formed therein in a smaller thickness than the film Fa.

<Step S2c> Form Film in Area C

As in steps S2a and S2b, this step S2c alternates an operation to move the inkjet head 11 in the radial direction DR of the wafer W, and an operation to discharge droplets from each nozzle 12 while rotating the wafer W with the inkjet head 11 standing still in a predetermined position. Consequently, as shown in FIG. 5C, the inkjet head 11 is located in the area C to form film Fc in the area C.

When the film Fc is formed in this area C, the controller 41 adjusts a discharge quantity of resist based on the treating recipe to make the film Fc thinner than the film Fb.

When the wafer W makes one rotation, the controller 41 stops rotation of the wafer W, and stops discharge of the droplets from the nozzles 12. Further, the controller 41 moves the inkjet head 11 to the withdrawn position.

As a result, as shown in FIG. 6C, the entire wafer W is covered with films Fa, Fb and Fc. In the following description, the films Fa, Fb and Fc, when not distinguished, will be called simply "film F". The thickness of film F increases stepwise from the edge region to the central region of the wafer W. The film Fc in the area C is thinner than the films Fa and Fb in the areas A and B.

<Step S3> Rotate Wafer W (Step of Moving Coating Solution in Film)

The controller 41 controls the motor 5 to rotate the wafer W at a second speed higher than the first speed. The second speed, preferably, is high speed which is, for example, 3000 [rpm]. Centrifugal force acts on the film F, whereby the resist forming the film F on the wafer W moves outward in the radial direction DR.

Figure 7A:
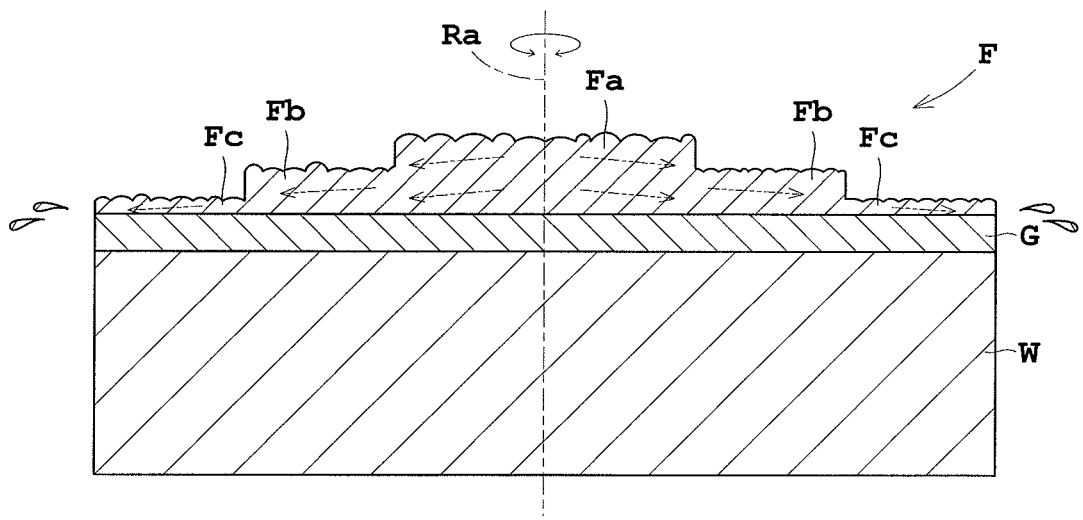
FIG. 7A is a sectional view schematically showing how a resist moves in the film.
Figure 7B:
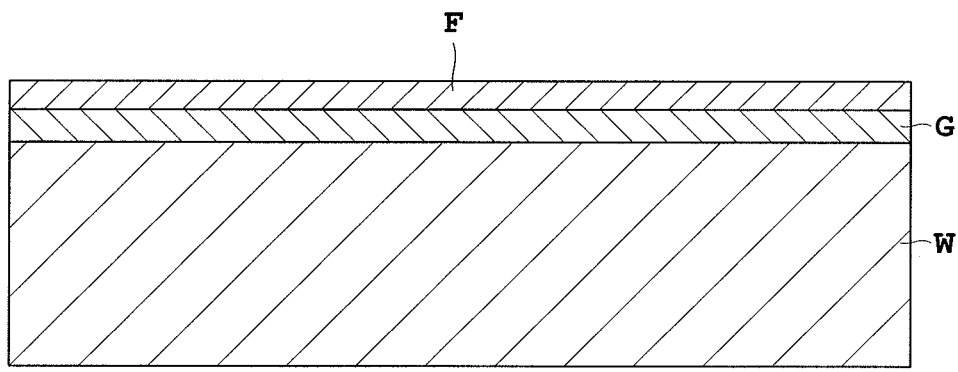
FIG. 7B is a sectional view schematically showing the film at completion of step S3.

FIG. 7A is a sectional view schematically showing how the resist moves in the film F. FIG. 7B is a sectional view schematically showing a state of the film F at completion of step S3.

As shown in FIG. 7A, the resist in the film F moves from the central region toward the edge region of the wafer W. Specifically, the resist flows out of the film Fa and into the film Fc. Part of the resist spins off the edges of the wafer W to be discarded to the ambient of the wafer W.

Consequently, while the thickness of the film Fa decreases, the thickness of the film Fc increases. Since the film F is formed beforehand to have the thickness increasing stepwise from the edge region to the central region of the wafer W as described in step S2, the variations in the thickness of the film F are eased and the thickness of the film F becomes substantially uniform over the surface of the wafer W.

The movement of the resist in the film F levels and smoothes out the surface of the film F.

Upon lapse of a predetermined time, the controller 41 controls the motor 5 to stop rotation of the wafer W.

As a result, at completion of step S3, the film F of substantially uniform thickness and with a smoothed surface is obtained as shown in FIG. 7B.

Thus, according to the coating apparatus in Embodiment 1, step S2 (form film) chooses to form the film F thicker in the central region than in the edge region of the wafer W. Therefore, when step S3 (rotate wafer W) is executed to move the resist in the film F from the central region to the edge region of the wafer W, the surface of the film F can be made smoother and the thickness of the film F can be made substantially uniform over the entire wafer W.

In step S2, the film F is formed over the edge region and central region of the wafer W with the thickness increasing toward the central region. Thus, at completion of step S3 (rotate wafer W), the film F obtained has a still higher degree of uniformity in thickness.

The steps S2a to S2c are executed to repeat three times an alternation of the operation to make the inkjet head 11 stand still and discharge droplets from each nozzle 12 while rotating the wafer W, and the operation to move the inkjet head 11 in the radial direction DR of the wafer W. Consequently, the films Fa to Fc can be formed individually in the concentric circular areas A to C.

In step S2, the thickness of the film F is varied for each of the areas A, B and C, and the films Fa, Fb and Fc are each formed to have a uniform thickness within the area A, B or C. Therefore, the film can be formed simply. The controller 41 may control the nozzles 12 uniformly in each of the steps S2a to S2b, which can simplify the control by the controller 41.

In step S2a, the position of each nozzle 12 does not change in the radial direction DR of the wafer W, thereby forming the film Fa easily. Similarly, in step S2b and S2c also, the position of each nozzle 12 does not change in the radial direction DR of the wafer W, thereby forming the films Fb and Fc easily. This can simplify the control of the nozzles 12 by the controller 41.

Since the nozzles 12 are the inkjet type, the discharge quantity of resist can be adjusted finely and accurately according to positions or areas of the wafer W. Therefore, the film F can be formed advantageously to have varied thicknesses between the edge region and the central region of the wafer W as described hereinbefore.

Since the wafer W is rotated at the first speed in step S2 lower than the second speed, the droplets can be applied accurately from the nozzles 12 to varied positions on the wafer W. Therefore, the film F can be formed highly reliably.

Since the wafer W is rotated at the second speed in step S3 higher than the first speed, centrifugal force can act on the film F effectively. As a result, the uniformity of the thickness of the film F can be further improved.

Since step S2 is preceded by the step (step S1) of supplying the solvent of the resist to the wafer W, the resist discharged onto the wafer W spreads easily. This can promote smoothing of the film F. The resist in the film F can move easily in step S3, which can improve uniformity of the thickness of the film F advantageously.

Embodiment 2

Next, Embodiment 2 of this invention will be described with reference to the drawings.

Embodiment 2 will also be described taking for example a coating apparatus for coating a resist as a coating solution. Embodiment 2 is different from Embodiment 1 mainly in the construction relating to the inkjet head, and therefore the construction in Embodiment 2 will be described centering on the inkjet head. The other components such as the rotating holder 1 and solvent feeder 31 are substantially the same as in Embodiment 1. Like reference signs will be affixed to like components in Embodiment 1.

Figure 8:
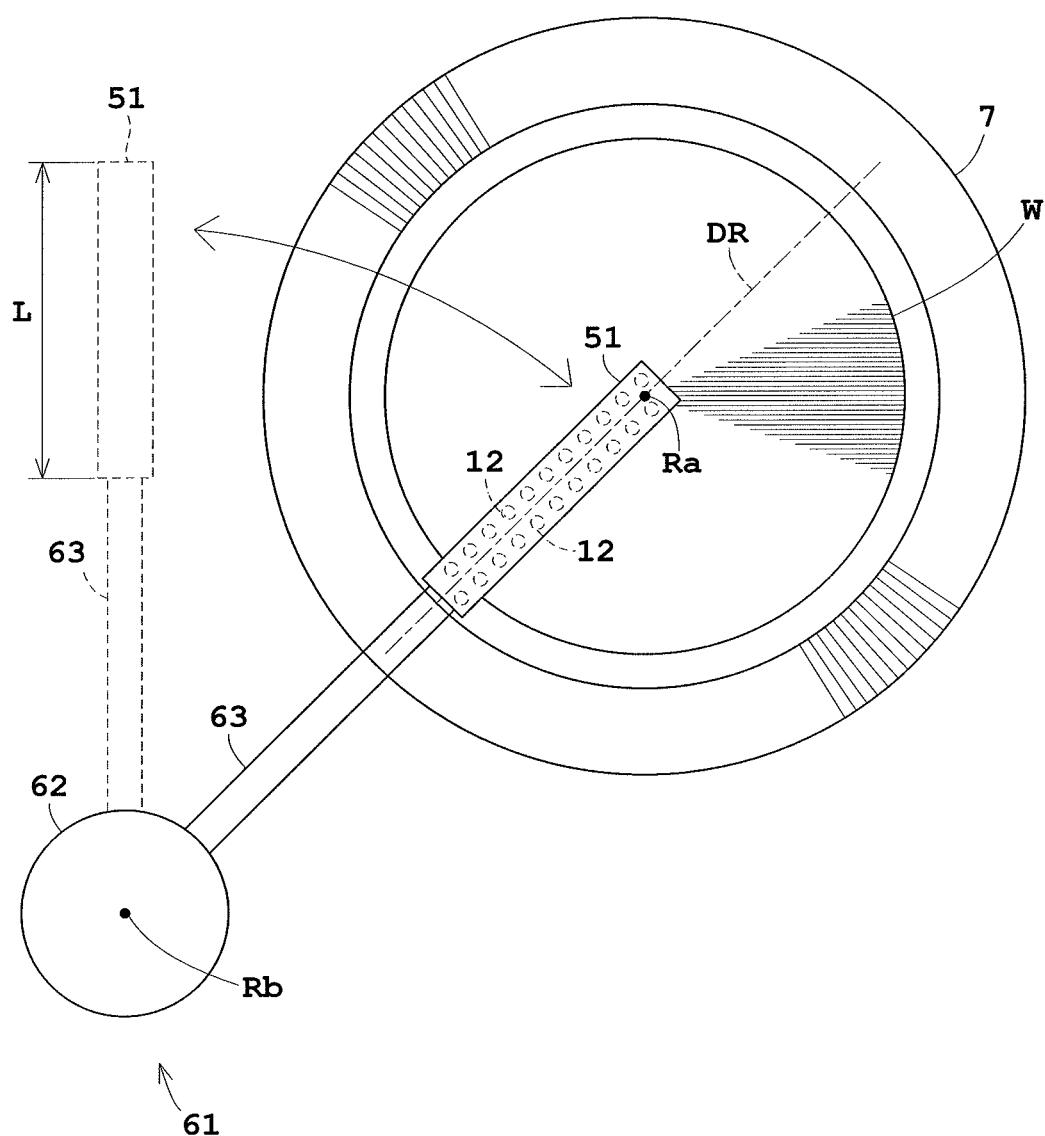
FIG. 8 is a plan view of a coating apparatus according to Embodiment 2.

FIG. 8 is a plan view of the coating apparatus according to Embodiment 2. Embodiment 2 provides an inkjet head 51 which is longer than the inkjet head 11 in Embodiment 1. The inkjet head 51 has a length L in a longitudinal direction thereof which is about the same as the radius of the wafer W. The inkjet head 51 has numerous nozzles 12 formed on the bottom surface thereof.

This apparatus has a head moving mechanism 61 for movably supporting the inkjet head 51. The head moving mechanism 61 has a swivel 62 and an arm 63. The swivel 62 supports a proximal end of the arm 63, and can swing the arm 63 about a substantially vertical rotational axis Rb passing through the swivel 62. The arm 63 supports the inkjet head 51. When the swivel 62 is driven, the inkjet head 51 makes turning movement (rotating movement) horizontally, to move between a position over the wafer W and a withdrawn position (the position of the inkjet head 51 shown in dotted lines in FIG. 8) away from over the wafer W.

In this embodiment, the head moving mechanism 61 is constructed capable of placing the inkjet head 51 in a treating position (the position of the inkjet head 51 shown in solid lines in FIG. 8) where the inkjet head 51 extends between the central region and the edge region of the wafer W. When the inkjet head 51 is in the treating position, the nozzles 12 are arranged along a radial direction DR of the wafer W between the rotational axis Ra and the edge region. This head moving mechanism 61 does not constitute the relative moving mechanism in this invention. In Embodiment 2, only the rotating holder 1 acts as the relative moving mechanism in this invention.

Figure 9:
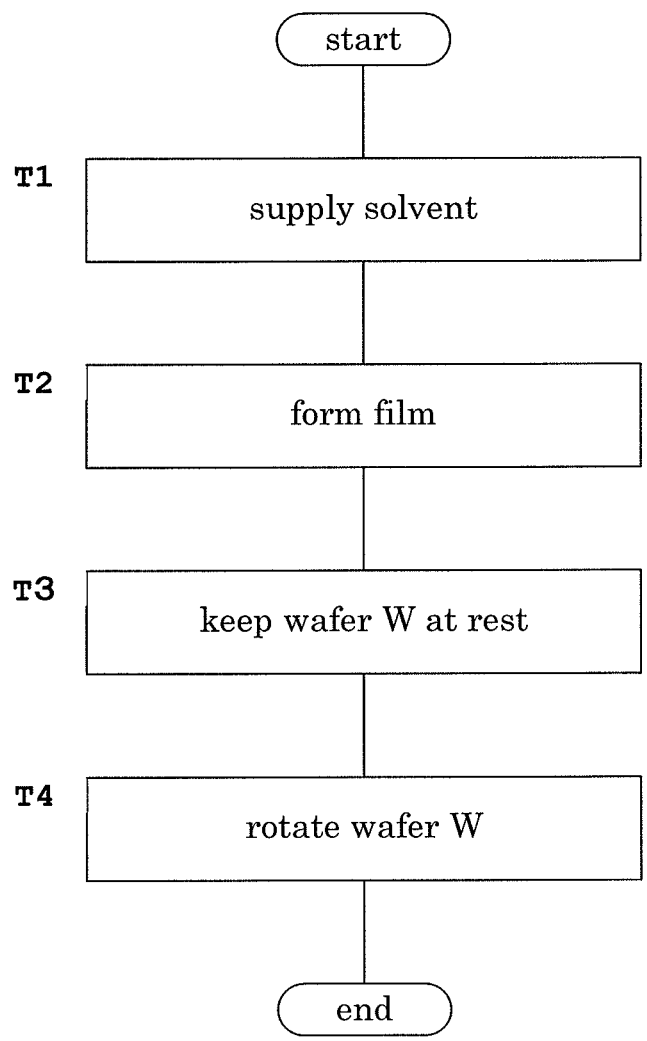
FIG. 9 is a flow chart showing operation of the coating apparatus according to Embodiment 2.

Next, operation of the coating apparatus (coating method) according to Embodiment 2 will be described. FIG. 9 is a flow chart showing operation of the coating apparatus according to Embodiment 2. It is assumed that the wafer W has been transported to the coating apparatus from outside, and is already held by the spin chuck 3. Processes similar to those in Embodiment 1 will be described briefly.

<Step T1> Supply Solvent (Step of Supplying Solvent of Coating Solution to Substrate)

The controller 41 moves the solvent feeder 31 from the withdrawn position to the position over the wafer W. Then, the controller 41 supplies the solvent from the solvent feeder 31 onto the wafer W, and rotates the wafer W. Consequently, the upper surface of the wafer W is coated with the solvent.

<Step T2> Form Film (Step of Forming Film)

The controller 41 controls the head moving mechanism 61 to swing the inkjet head 51 from the withdrawn position to the treating position, and put the inkjet head 51 at rest in the treating position. Then, the controller 41 rotates the wafer W at the first speed, and controls each nozzle 12 to discharge droplets of the resist to the wafer W.

The inkjet head 51 makes a rotating movement in a circumferential direction at uniform speed relative to the wafer W. Droplets of the resist discharged from nozzles 12 impinge on a range of the wafer W opposed to the inkjet head 51 to form a film (specifically, a resist film) F there.

Figure 10:
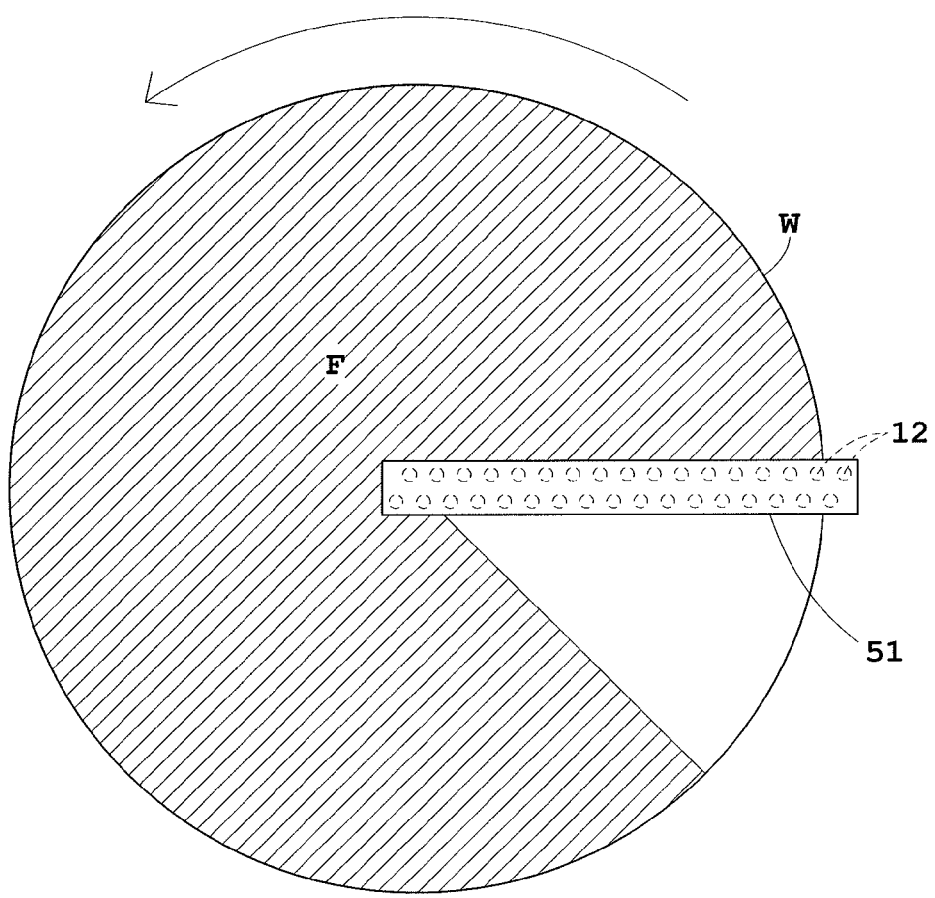
FIG. 10 is a view schematically showing a film being formed on a substrate.

Reference is made to FIG. 10. FIG. 10 is a view schematically showing a film being formed on the wafer W. As is clear from FIG. 10, the film F can be formed over the entire surface of the wafer W only by one rotation of the wafer W.

At this time, the controller 41 adjusts a discharge quantity of resist from each nozzle 12 based on the treating recipe to form the film F with a thickness thereof gradually increasing from the edge region toward the central region of the wafer W. In other words, the controller 41 gradually increases the discharge quantity of resist per unit area from the edge region toward the central region of the wafer W.

When the wafer W makes one rotation, the controller 41 stops discharge of the droplets from the nozzles 12, moves the inkjet head 51 to the withdrawn position, and stops rotation of the wafer W.

Figure 11:
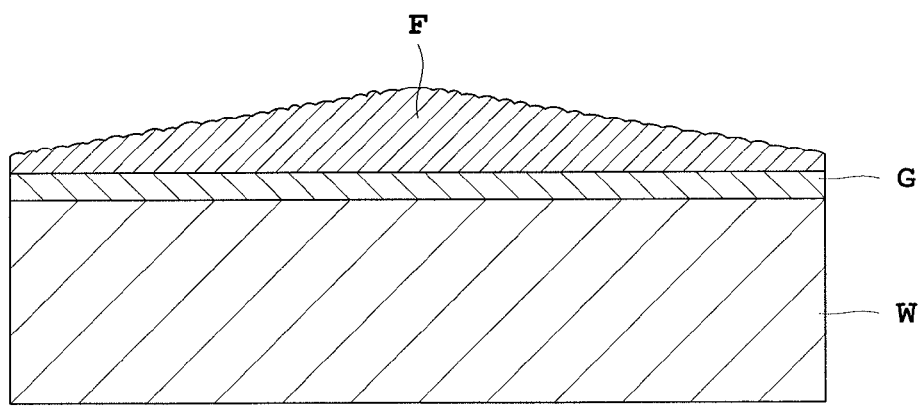
FIG. 11 is a sectional view schematically showing the film at completion of step T2.

Reference is made to FIG. 11. FIG. 11 is a sectional view schematically showing the film F on the wafer W at completion of this step T2. As shown, the film F has a thickness gradually increasing over a range from the edge region to the central region of the wafer W.

<Step T3> Keep Wafer W at Rest (Step of Keeping the Substrate at Rest)

The controller 41 keeps the wafer W at rest for a predetermined time without rotating the wafer W. The droplets after impingement become blended together (each droplet spreads) with progress of time. That is, even if irregularities exist on the surface of the film F at completion of step T2, these irregularities are slowly leveled in the course of step T3.

<Step T4> Rotate Wafer W (Step of Moving Coating Solution in Film)

The controller 41 rotates the wafer W at the second speed higher than the first speed. Centrifugal force acts on the film F, whereby the resist forming the film F on the wafer W moves outward in the radial direction DR. Consequently, while the thickness of the film F decreases in the central region of the wafer W, the thickness of the film F increases in the edge region of the wafer W. Since the film F is formed beforehand to have the thickness gradually increasing from the edge region to the central region of the wafer W as described in step T2, the movement of the resist in the film F eases the variations in the thickness of the film F.

Upon lapse of a predetermined time, the controller 41 stops rotation of the wafer W. As a result, at completion of step T4, the film F obtained has a substantially uniform thickness. The movement of the resist in the film F levels and smoothes out the surface of the film F.

Thus, also the coating apparatus in Embodiment 2, as in Embodiment 1, can at once accomplish smoothing of the surface of the film F and uniforming of the thickness of the film F.

According to the coating apparatus in Embodiment 2, the inkjet head 51 having a length at least corresponding to the radius of the wafer W can be placed over the central region and edge region of the wafer W. Therefore, step T2 (for forming the film) can complete formation of the film F only by one rotation of the wafer W.

Since step T3 (keep wafer W at rest) is executed after step T2 (form film) and before step T4 (rotate wafer W), the droplets after impingement and adjoining one another on the wafer W can be further blended together, which promises a continuation of droplets with increased smoothness. Therefore, when step T4 is executed, the surface of the film F can be smoothed easily.

This invention is not limited to the foregoing embodiments, but may be modified as follows:

(1) In Embodiment 1 described hereinbefore, step S2 is executed to form the film F having the thickness increasing stepwise from the edge region to the central region of the wafer W as shown in FIG. 6C. In Embodiment 2, step T2 is executed to form the film F having the thickness increasing gradually over the range from the edge region to the central region of the wafer W as shown in FIG. 11. However, the film F is not limited to these. For example, the film may have a thickness increasing at a constant rate from the edge region toward the central region of the wafer W. Or the film may have a thickness increasing at varied rates from the edge region toward the central region of the wafer W.

Figure 12:
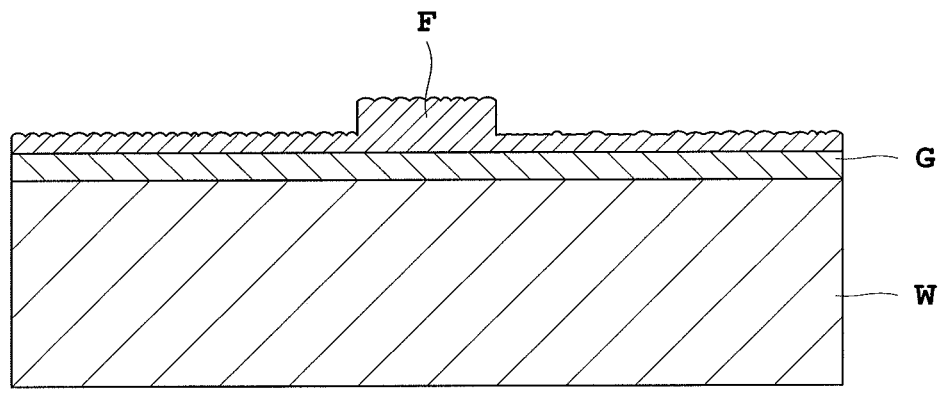
FIG. 12 is a sectional view schematically showing a film according to a modified embodiment.

As long as the film is thicker in the central region of the wafer W than in the edge region thereof, its thickness does not need to change (i.e. the thickness may be constant) in the range from the central region to the edge region. Reference is made to FIG. 12. FIG. 12 shows an example of sectional view of a film F according to a modified embodiment. As shown, the film F has a large thickness only in the central region of the wafer W, and a constant thickness (which does not change) in the range (including the edge region) other than the central region. With such film F also, since the film thickness is larger in the central region of the wafer W than in the edge region, the film F obtained at completion of step S3 (T4) has a substantially uniform thickness as in Embodiments 1 and 2.

Contrary to the film F shown in FIG. 12, the film F may have a small thickness only in the edge region of the wafer W, and a constant thickness (which does not change) in the range (including the central region) other than the edge region.

(2) In each of Embodiments 1 and 2 described hereinbefore, step S2 (T2) is executed to rotate the wafer W, thereby to move the wafer W and inkjet head 11 or 51 relative to each other. However, the invention is not limited to this. For example, the wafer W and inkjet head 11 or 51 may be moved relative to each other by moving the inkjet head 11 or 51 without rotating the wafer W (while keeping it at rest).

Figure 13:
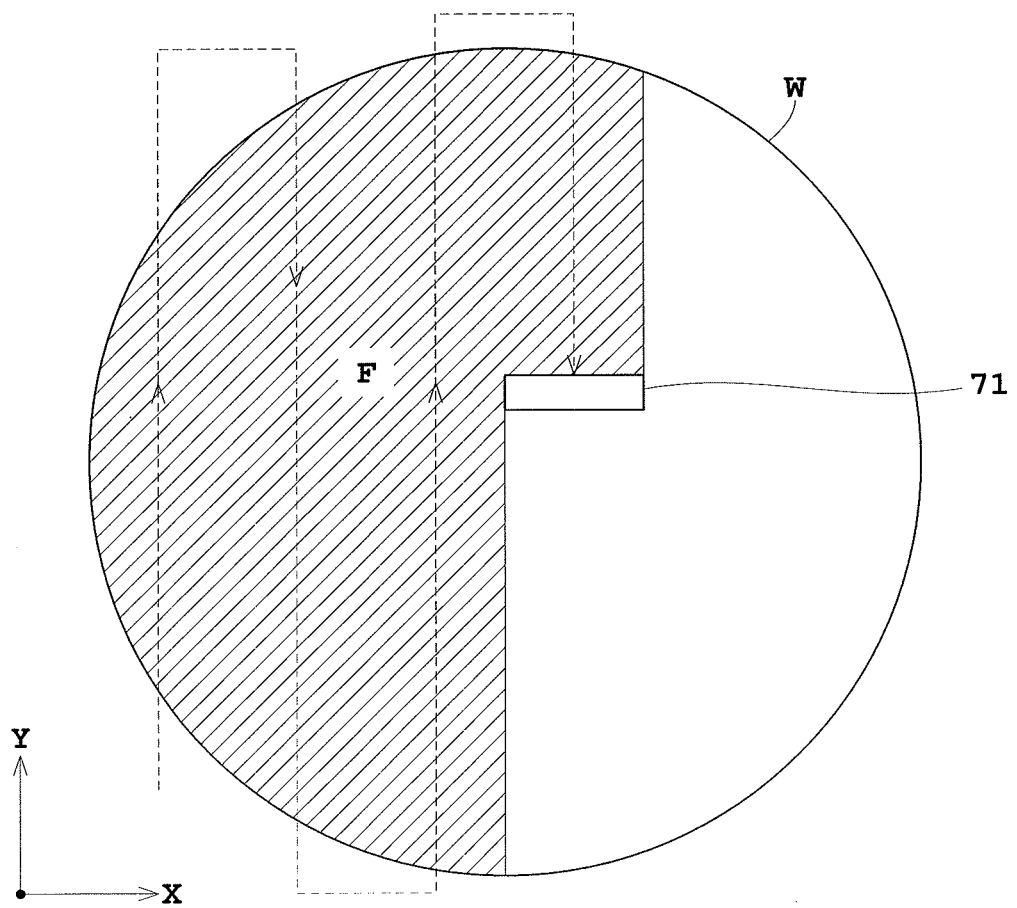
FIG. 13 is a view schematically showing a film being formed on a substrate by a coating apparatus (method) according to a modified embodiment.

Reference is made to FIG. 13. FIG. 13 is a view schematically showing a film being formed on a wafer W by a coating apparatus (method) according to a modified embodiment. In this modification, an inkjet head 71 is movable in horizontal biaxial directions by a head moving mechanism not shown. FIG. 13 shows the horizontal biaxial directions with "X" axis and "Y" axis, respectively. A film F may be formed on a wafer W by discharging droplets of the resist from the nozzles 12 while translating the inkjet head 71 over the entire surface of the wafer W. In this modification, the head moving mechanism, not shown, corresponds to the relative moving mechanism in this invention.

According to such modified embodiment, compared with the case of rotating the inkjet heads 11 and 51 relative to the wafer W as in Embodiments 1 and 2, amounts of movement (displacement) of the respective nozzles 12 relative to the wafer W can be made uniform. Therefore, the discharge quantity of resist per unit area can be adjusted easily, and the thickness of film F can be adjusted easily.

(3) In Embodiment 2 described hereinbefore, step T2 is executed with the single inkjet head 51 placed in the treating position, but this is not limitative. For example, step T2 may be executed with a plurality of inkjet heads arranged over the central region and the edge region of the wafer W. As an apparatus construction, the long inkjet head 51 may replaced with a plurality of inkjet heads each having a length L in the longitudinal direction thereof shorter than the radius of the wafer W.

(4) In Embodiment 1 described hereinbefore, when forming the film F in the areas A, B and C, respectively (step S2), the rotating speed of the wafer W is the first speed throughout. This is not limitative. When forming the film F in the areas A to C, the wafer W may be rotated at different speeds, respectively.

(5) In Embodiment 1 described hereinbefore, the film F is formed in the areas A, B and C in this order. This is not limitative. The order of areas A to C for forming the film F may be changed arbitrarily.

(6) Each embodiment described hereinbefore has been described taking a resist as an example of coating solution. This is not limitative. The coating solution may be changed to an SOG solution, a solution of low dielectric film material, or a solution of polyimide resin.

(7) The components of the foregoing embodiments and modified embodiments may be combined in varied ways as appropriate.

This invention may be embodied in other specific forms without departing from the spirit or essential attributes thereof and, accordingly, reference should be made to the appended claims, rather than to the foregoing specification, as indicating the scope of the invention.

What is claimed is:

1. A coating method comprising:
   a step of forming a film of a coating solution over an entire surface of a substrate, the film having a larger thickness in a central region of the substrate than in an edge region of the substrate by discharging droplets of the coating solution from a plurality of nozzles formed on an inkjet head to the substrate; and
   a step of moving the coating solution in the film from the central region toward the edge region of the substrate by rotating the substrate without discharging the droplets from the inkjet head,
   wherein the step of forming the film includes:
   a first discharging step of discharging the droplets from the inkjet head with the inkjet head disposed at a first position while rotating the substrate, to form a circular first film having a first thickness in the central region of the substrate, and
   a second discharging step of discharging the droplets from the inkjet head with the inkjet head disposed at a second position while rotating the substrate, to form an annular second film having a second thickness adjoining a periphery of the first film, the second thickness being smaller than the first thickness; and
   wherein the step of forming the film includes moving the inkjet head without rotating the substrate and without discharging the droplets from the inkjet head between the first and second discharging steps; and
   wherein the step of forming the film adjusts a discharge quantity of the inkjet head to allow the discharge quantity per unit area in the central region of the substrate to be larger than that in the edge region of the substrate.

2. The method according to claim 1 wherein the step of forming the film is executed to form the film which has a thickness increasing from the edge region toward the central region of the substrate.

3. The method according to claim 1 wherein the step of forming the film is executed to discharge the droplets from the nozzles to the substrate while moving the inkjet head and the substrate relative to each other at least by rotating the substrate, a rotating speed of the substrate in the step of forming the film being lower than a rotating speed of the substrate in the step of moving the coating solution in the film.

4. The method according to claim 1 wherein the step of forming the film includes:
   a step of discharging the droplets from the nozzles while keeping the inkjet head at rest and rotating the substrate; and a step of moving the inkjet head radially of the substrate;
the film being formed by repeating an alternation of the step of discharging the droplets and the step of moving the inkjet head.

5. The method according to claim 1 wherein the step of forming the film is executed to place the inkjet head over the central region and the edge region of the substrate, and discharge the droplets from the nozzles to the substrate while rotating the substrate.

6. The method according to claim 1 comprising a step of supplying a solvent of the coating solution to the substrate before the step of forming the film.

7. The method according to claim 1 comprising a step of keeping the substrate at rest after the step of forming the film and before the step of moving the coating solution in the film.

8. The method according to claim 1 wherein the step of forming the film is executed to reduce a size of the droplets discharged from the nozzles for the edge region of the substrate compared with the central region of the substrate.

9. The method according to claim 1 wherein the step of forming the film is executed to reduce a frequency of discharging the droplets from the nozzles for the edge region of the substrate compared with the central region of the substrate.

10. A coating method comprising:
a step of forming a film of a coating solution over an entire surface of a substrate, the film having a larger thickness in a central region of the substrate than in an edge region of the substrate by discharging droplets of the coating solution from a plurality of nozzles formed on an inkjet head to the substrate; and
a step of moving the coating solution in the film from the central region toward the edge region of the substrate by rotating the substrate without discharging the droplets from the inkjet head,
wherein the step of forming the film includes:
a first discharging step of discharging the droplets from the inkjet head with the inkjet head disposed at a first position while rotating the substrate, to form a circular first film having a first thickness in the central region of the substrate, and
a second discharging step of discharging the droplets from the inkjet head with the inkjet head disposed at a second position while rotating the substrate, to form an annular second film having a second thickness adjoining a periphery of the first film, the second thickness being smaller than the first thickness; and
wherein the step of forming the film is executed to increase a discharge quantity per unit area in the central region of the substrate than that in the edge region of the substrate, and to form the film having the larger thickness in the central region of the substrate than in the edge region of the substrate by adjusting at least one of a size of the droplets discharged from the nozzles and a frequency of discharging the droplets from the nozzles.

11. The method according to claim 10 wherein the step of forming the film is executed to form the film which has a thickness increasing from the edge region toward the central region of the substrate.

12. The method according to claim 10 wherein the step of forming the film is executed to discharge the droplets from the nozzles to the substrate while moving the inkjet head and the substrate relative to each other at least by rotating the substrate, a rotating speed of the substrate in the step of forming the film being lower than a rotating speed of the substrate in the step of moving the coating solution in the film.

13. The method according to claim 10 wherein the step of forming the film includes:
a step of discharging the droplets from the nozzles while keeping the inkjet head at rest and rotating the substrate; and
a step of moving the inkjet head radially of the substrate;
the film being formed by repeating an alternation of the step of discharging the droplets and the step of moving the inkjet head.

14. The method according to claim 10 wherein the step of forming the film is executed to place the inkjet head over the central region and the edge region of the substrate, and discharge the droplets from the nozzles to the substrate while rotating the substrate.

15. The method according to claim 10 wherein the step of forming the film is executed to discharge the droplets from the nozzles to the substrate while translating the inkjet head without rotating the substrate.

16. The method according to claim 10 comprising a step of supplying a solvent of the coating solution to the substrate before the step of forming the film.

17. The method according to claim 10 comprising a step of keeping the substrate at rest after the step of forming the film and before the step of moving the coating solution in the film.

18. The method according to claim 10 wherein the step of forming the film is executed to reduce a size of the droplets discharged from the nozzles for the edge region of the substrate compared with the central region of the substrate.

19. The method according to claim 10 wherein the step of forming the film is executed to reduce a frequency of discharging the droplets from the nozzles for the edge region of the substrate compared with the central region of the substrate.

20. The method according to claim 1, wherein the step of forming the film further includes a third discharging step of discharging the droplets from the inkjet head with the inkjet head disposed at a third position to form an annular third film having a third thickness adjoining a periphery of the second film, the third thickness being smaller than the second thickness.

21. The method according to claim 10, wherein the step of forming the film further includes a third discharging step of discharging the droplets from the inkjet head with the inkjet head disposed at a third position to form an annular third film having a third thickness adjoining a periphery of the second film, the third thickness being smaller than the second thickness.

22. The method according to claim 1, wherein
the first discharging step forms a first film while the substrate makes one rotation, and stops rotation of the substrate and discharge of the droplets from the inkjet head after the substrate has made one rotation after having started the first discharging step; and
the second discharging step forms a second film while the substrate makes one rotation, and stops rotation of the substrate and discharge of the droplets from the inkjet head after the substrate has made one rotation after having started the second discharging step.

23. The method according to claim 10, wherein
the first discharging step forms a first film while the substrate makes one rotation, and stops rotation of the substrate and discharge of the droplets from the inkjet head after the substrate makes one rotation after having started the first discharging step; and the second discharging step forms a second film while the substrate makes one rotation, and stops rotation of the substrate and discharge of the droplets from the inkjet head after the substrate has made one rotation after having started the second discharging step.

\* \* \* \* \*